United States Patent [19]

Hearn

[11] Patent Number: 5,475,567
[45] Date of Patent: Dec. 12, 1995

[54] METHOD FOR HERMETICALLY SEALING A SINGLE LAYER CERAMIC THICK FILM ELECTRONIC MODULE

[75] Inventor: John A. Hearn, Kokomo, Ind.

[73] Assignee: Delco Electronics Corp., Kokomo, Ind.

[21] Appl. No.: 169,237

[22] Filed: Dec. 20, 1993

[51] Int. Cl.[6] .................................... H05K 1/18
[52] U.S. Cl. .................. 361/778; 361/760; 361/807; 361/809; 174/52.4; 257/668
[58] Field of Search ...................... 361/760, 761, 361/767, 772–779, 783, 789, 762, 792, 793, 794, 807, 809; 257/668, 684, 700, 723, 724; 174/52.4, 253, 255, 260, 261; 29/840

[56] References Cited

U.S. PATENT DOCUMENTS 5,049,978  9/1991  Bates et al. ........................... 357/74

FOREIGN PATENT DOCUMENTS 4051584  2/1992  Japan ...................... 361/818

*Primary Examiner*—Leo P. Picard
*Assistant Examiner*—Y. Whang
*Attorney, Agent, or Firm*—Mark A. Navarre

[57] ABSTRACT

A method is provided for hermetically sealing a surface-mounted thick film electronic module within a cover soldered to a ceramic substrate, under the circumstances in which the input/output terminals of the electronic module are electrically interconnected with their corresponding external conductors on the exterior of the cover with a number of conductors. The integrity of the hermetic seal is promoted by routing the conductors beneath the ceramic substrate, as opposed to printing the conductors directly on the surface of the ceramic substrate, which necessitates that a dielectric material be placed intermediate the conductors and the bond material so as to electrically isolate the conductors from the bond material and cover. Consequently, an advantage of the present invention is the avoidance of a material mismatch between the dielectric material and the bonding material and the cover.

8 Claims, 1 Drawing Sheet

METHOD FOR HERMETICALLY SEALING A SINGLE LAYER CERAMIC THICK FILM ELECTRONIC MODULE

The present invention generally relates to methods for electrically interconnecting thick film electronic modules with external conductors formed on a single layer ceramic substrate to which the electronic module is mounted. More particularly, this invention relates to an improved method for routing electrical conductors from a hermetically sealed electronic module to its external conductors, such that the electrical conductors are not routed through the hermetic seal between the substrate and a cover enclosing the electronic module, so as to enhance the reliability of the hermetic seal.

BACKGROUND OF THE INVENTION

Hybrid integrated circuits used in automotive applications often employ thick film electronic modules which are mounted on a surface of a single layer ceramic substrate. Conductors are typically printed on the substrate to electrically interconnect the input/output terminals of the electronic modules with their respective external conductors formed on the substrate, which interconnect the conductors with an external circuit.

At times it is required to isolate these electronic modules from air, dust and moisture by hermetically enclosing them within a cover or housing that is bonded to the substrate. To do so, a suitable conductive material, such as a palladium-silver composition, is first deposited on the substrate, in that solder compositions will not adequately wet the substrate material. A suitable solder composition is then fired over the conductive material, and the cover is bonded to the substrate using a solder fellow process. Because the conductors which interconnect the input/output terminals of the electronic modules with the external conductors are printed on the surface of the substrate, the conductors are routed directly through the hermetic seal formed by the solder between the cover and the substrate. As a result, it is necessary to first fire a dielectric material over the conductors in the area where the cover is to be soldered to the substrate in order to provide electrical insulation between the conductors and the conductive material. The conductive material is then deposited, and the solder is fired over the conductive material in order to bond the cover to the substrate and, in the effected locations, the dielectric material.

A drawback to the approach described above is that the solder-conductive material-dielectric-conductor bond is not as strong as the solder-conductive material-substrate bond. Furthermore, stresses are created in the entire module structure as a result of differences in the physical properties of the substrate, conductor, dielectric, conductive material, solder and cover materials. In particular, different thermal coefficients of expansion between the individual materials tend to create stresses as a result of the soldering process during assembly and thermal cycling which occurs in service. As would be expected, such internal stresses significantly reduce the reliability of the bonds, and particularly the solder-conductive material-dielectric-conductor bond. In that the failure of any one of the bonds will also result in the loss of the hermetic seal between the cover and the substrate, such stresses may ultimately lead to the ingress of air, dust and moisture within the cover, allowing the hostile environment to attack the electronic module.

Thus, it would be desirable if an alternative method were available by which a hermetically sealed electronic module could be electrically interconnected with its external conductors without jeopardizing the integrity of the module's hermetic seal. A suitable method would not significantly complicate the processing of the electronic module, its cover or the ceramic substrate, nor have a detrimental effect on the ability to readily interconnect the module's input/output terminals to their respective conductors under high volume manufacturing conditions, such as that demanded for the automotive industry.

SUMMARY OF THE INVENTION

It is an object of this invention to provide a method by which a thick film electronic module which is mounted to a ceramic substrate and hermetically sealed within a cover bonded to the ceramic substrate, is electrically interconnected to its corresponding external conductor located on the ceramic substrate exterior to the cover, without the electrical interconnection being routed through the bond between the cover and the ceramic substrate.

It is a further object of this invention that such a method involve forming passages through the ceramic substrate, through which conductors which electrically interconnect the electronic module with its external conductors can be routed beneath the cover-substrate bond.

It is still a further object of this invention that such a method include sealing the passages so as to hermetically seal the electronic module within the cover.

In accordance with a preferred embodiment of this invention, these and other objects and advantages are accomplished as follows.

According to the present invention, there is provided a method for electrically interconnecting a thick film electronic module with its corresponding external conductors formed on a ceramic substrate. In particular, the method is directed to routing conductors for an electronic module which is enclosed within a cover bonded to the ceramic substrate, such that the cover and ceramic substrate form a hermetic seal located between the electronic module and its external conductors. The method completely avoids the seal region between the cover and ceramic substrate by routing the conductors through the ceramic substrate to the backside of the ceramic substrate. The conductors then traverse the backside of the ceramic substrate until beyond the seal region, at which point the conductors are routed up through the ceramic substrate to their corresponding external conductors. The method of this invention results in a ceramic substrate structure which is also encompassed by the teachings of this invention.

The method generally includes forming, for each input/output terminal of the electronic module, a first hole through the ceramic substrate adjacent the electronic module, and a second hole through the ceramic substrate adjacent the external conductor. An electrical conductor is then formed which will serve to electrically interconnect an input/output terminal of the electronic module to its corresponding external conductor. The electrical conductor is routed through the first hole from a first surface of the ceramic substrate to the opposite surface of the ceramic substrate, extends along the second surface to the second hole, and then is routed through the second hole to the region on the first surface of the ceramic substrate at which the external conductor has or will be formed. A dielectric tape is then adhered to the second surface of the ceramic substrate so as to hermetically seal at least the first hole.

Because the conductor is routed beneath the ceramic substrate instead of over the surface of the substrate, the cover can be more reliably bonded to the ceramic substrate in that an intermediate dielectric layer is not required between the conductor and the solder and cover. Primarily then, the advantages made possible by the novel method of this invention include a more reliable and durable bond between the cover which encloses a thick film electronic module and the ceramic substrate to which the electronic module is mounted. The method of this invention significantly reduces the likelihood that the bond will fail due to stresses created by mismatch of physical properties, which particularly occurs in the prior art where a dielectric material is required between the conductors and the cover. As a result, the reliability of the hermetic seal between the cover and the substrate is improved. The enhanced reliability of the hermetic seal is particularly desirable within hostile environments, such as an automotive environment, for the purpose of preventing exposure of the electronic module to air, dust and moisture. Consequently, the method of this invention particularly increases the reliability of hybrid integrated circuits which are required to survive numerous repeated thermal cycles within a hostile environment.

Other objects and advantages of this invention will be better appreciated from the following detailed description.

DESCRIPTION OF THE DRAWINGS

The above and other advantages of this invention will become more apparent from the following description taken in conjunction with the accompanying drawings wherein.

DETAILED DESCRIPTION OF THE INVENTION

A method is provided for enhancing the sealing integrity and reliability of a hermetic bond between a ceramic substrate and a cover for a surface-mounted thick film electronic module. In particular, the method is directed to electronic modules whose input/output terminals are each electrically interconnected with their corresponding external conductors by a thick film conductor printed on the substrate. The hermetic sealing capability of the hermetic bond is promoted by routing the conductors through the substrate, as opposed to printing the conductors directly on the surface of the substrate, as is conventionally done. As such, the bond area between the cover and substrate is not intermittently interrupted by the conductors, which otherwise necessitates a dielectric material to isolate the conductors from the bond material and cover. Consequently, an advantage of the present invention is the avoidance of a material mismatch between the dielectric material and the bonding material and the cover.

Figure 1:
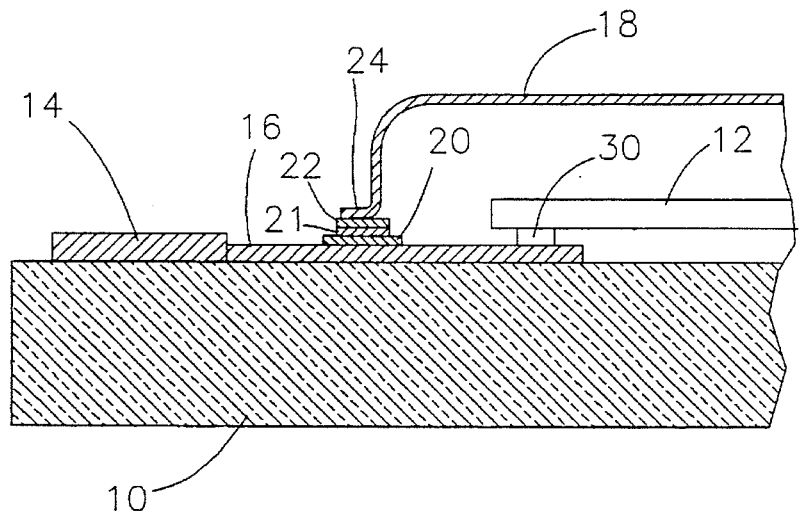
FIG. 1 shows a cross-sectional view of a hybrid integrated circuit utilizing known conductor routing techniques for electrically interconnecting the input/output terminals of a surface-mounted, thick film electronic module with external conductors formed on the substrate to which the module is mounted.

FIG. 1 illustrates a conventional manner by which an input/output terminal 30 of a thick film electronic module 12 is electrically connected to its corresponding external conductor 14, which electrically interconnects the electronic module 12 with an external circuit (not shown). As illustrated, the electronic module 12 is mounted to a surface of a ceramic substrate 10, which is preferably a single layer aluminum oxide substrate. Between the input/output terminal 30 and its external conductor 14 there is shown a thick film conductor 16 which has been printed on the surface of the substrate 10. As is conventional, the electronic module 12 is housed within a cover 18 which serves to hermetically seal the electronic module 12 from the environment. In order to form the required hermetic seal, as well as secure the cover 18 to the substrate 10, a lower flange 24 of the cover 18 is soldered to the substrate 10 with a solderable material 22, such as a gold-tin composition. However, a dielectric material 20, such as a glass material available as composition "5707" from Du Pont, is required between the solderable material 22 and the substrate 10 in order to electrically insulate the conductor 16 from the solderable material 22 and the cover 18. A conductor composition 21, such as a palladium-silver composition, is typically required between the solderable material 22 and the dielectric material 20 because of the inability for conventional solderable materials 22 to adequately wet the substrate 10 and the dielectric material 20.

Unfortunately, suitable dielectric materials have physical properties, such as a coefficient of thermal expansion, which differ significantly from that of the solderable material 22, as well as the cover 18. Consequently, the soldering process and repeated thermal cycling which occurs during the life of the electronic module 12, create stresses throughout the entire structure shown in FIG. 1, and particularly within the dielectric material 20 and the solderable material 22, which significantly reduce the reliability of the hermetic seal.

Figure 2:
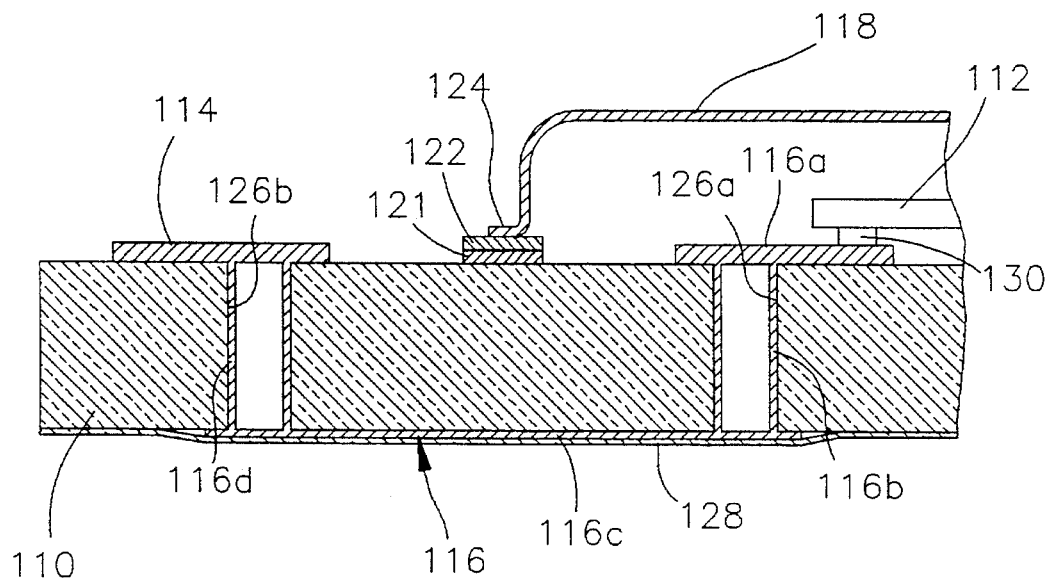
FIG. 2 shows a cross-sectional view of a hybrid integrated circuit utilizing a conductor which is routed through the circuit's substrate in accordance with this invention.

The present invention, as illustrated in FIG. 2, solves the above disadvantage associated with the prior art by rerouting the conductors such that they are not placed between the cover and the substrate. FIG. 2 illustrates a portion of a hybrid integrated circuit which has been processed in accordance with a preferred embodiment of the present invention. As shown, a thick film electronic module 112 is mounted to a surface of a substrate 110, on which are formed external conductors 114 that correspond in number to the input/output terminals 130 of the electronic module 112. As with the prior art, the electronic module 112 is housed within a cover 118 which serves to protect the electronic module 112 from the environment of the hybrid integrated circuit. However, in contrast to the prior art shown in FIG. 1, the present invention does not involve the printing of a conductor between the input/output terminal 130 and its external conductor 114 on the surface of the substrate 110, but routes a conductor 116 through the substrate 110 and beneath the sealing area between the cover 118 and the substrate 110.

To do so, this invention utilizes holes or passages 126a and 126b formed through the substrate 110. A first passage 126a is located within the region of the substrate 110 enclosed by the cover 118, while the second passage 126b is exterior of the cover 118, and terminates adjacent to or, more preferably, beneath an external conductor 114, as shown in FIG. 2. With this configuration, a first segment 116a of each conductor 116 can be printed on the surface of the substrate 110 so as to interconnect an input/output terminal 130 of the electronic module 112 with the first passage 126a. A second segment 116b of the conductor 116 projects through the first passage 126a to the lower surface of the substrate 10, at which point a third segment 116c traverses the lower surface to the second passage 126b. A fourth segment 116d of the conductor 116 projects up through the second passage 126b, such that the fourth segment 116d is electrically interconnected with the external conductor 114.

As an alternative to the above, the external conductors 114 could be formed on the lower surface of the substrate 110, such that only the first passage 126a and the first and second segments 116a and 116b are required to electrically connect the input/output terminals 130 with their respective external conductors 114.

Generally, the conductor 116 is preferably screen printed onto the substrate 110 in a conventional manner, which has been found to result in a suitable quantity of conductor material being deposited within the passages 126a and 126b. Using a screen printing technique, the second and fourth segments 116b and 116d are primarily formed as adherent layers on the walls of the passages 126a and 126b, though a sufficient amount of conductor material may be deposited such that the second and fourth segments 116b and 116d fill or close the passages 126a and 126b.

With the conductor 116 being routed primarily beneath the substrate 110, the dielectric material 20 conventionally required with the prior art is unnecessary between the cover 118 and the substrate 110. As a result, only a suitable solderable material 122 and a corresponding conductor material 121, such as those noted above under the discussion of FIG. 1, are required to solder the flange 124 of the cover 118 to the substrate 110. Accordingly, the method of this invention enables the creation of a more reliable and durable solder joint between the cover 118 and the ceramic substrate 110, in that the method significantly reduces the likelihood that the solder joint will fail due to stresses created by a mismatch of physical properties, as occurs between the dielectric material 20 of the prior art and the conductor 16 and solderable material 122. As a result, the reliability of the electronic module 112, as well as the integrated circuit to which the electronic module 112 belongs, is improved.

The enhanced reliability of the solder joint made possible by this invention is particularly desirable if a hermetic seal is required between the cover 118 and the ceramic substrate 110 for preventing the entry of air, dust and moisture beneath the cover 118. In that the passage 126a through the substrate 110 prevents the electronic module 112 from being completely sealed from the environment, a method for sealing at least the first passage 126a is necessary. FIG. 2 illustrates a preferred method by which the first passage 126a can be sealed with a dielectric tape 128, such as a glass ceramic tape which has been fired to the lower surface of the substrate 110. In accordance with this invention, a dielectric tape 128 has been found to suitably seal the passages 126a and 126b, so as to form a hermetical seal which prevents the ingress of moisture and air through the first passage 126a and into the enclosure formed by the cover 118. An additional advantage to using the dielectric tape 128 is that a printed circuit (not shown) can be provided on the dielectric tape 128, as is known in the art, such that an added layer of circuitry would be available in association with the substrate 110. While the dielectric tape 128 can be applied to completely cover the lower surface of the substrate 110, it may be preferable under some circumstances to selectively apply the dielectric tape 128. For example, it may be desirable to locate the dielectric tape 128 on the lower surface of the substrate 110 in a manner which avoids areas of the substrate 110 in which thermal conduction of heat would be detrimentally hampered by the low thermal conductivity of the dielectric tape 128.

Alternatively, a filler material could be selectively deposited to plug the passages 126a and 126b in order to form a hermetic seal. Materials such as those used to form the conductors 116, or dielectric materials, or materials such as those used to form thick film resistors could be screen printed on the lower surface of the substrate 110 for this purpose. However, it is believed that the use of such materials would not provide a seal which is as reliable as the seal obtained with the use of the dielectric tape 128 shown in FIG. 2.

The structure shown in FIG. 2 is preferably achieved by first forming the substrate 110 from a suitable material, an example of a preferred high temperature material being 96 percent alumina (aluminum oxide). Alternatively, low temperature substrate materials could be used. Prior to firing, the substrate 110 is in an unfired or "green" condition. With the substrate 110 in this condition, the first and second passages 126a and 126b (for each terminal/external conductor connection of each electronic module 112 to be mounted to the substrate 110) can be formed using a conventional punching operation, though other methods could be foreseeably used to perform this operation. The substrate 110 is then fired in accordance with conventional practices so as to produce a strong and solid substrate 110 which is capable of supporting a hybrid integrated circuit.

Next, the conductor 116 is preferably screen printed onto the substrate 110 using conventional techniques known to those skilled in the art. A suitable conductor material is a palladium-silver alloy, though other electrically conductive materials could be used for this purpose. Generally, a properly performed screen printing operation will be sufficient to deposit a suitable quantity of conductor material within the passages 126a and 126b. However, a second screen printing operation may be necessary to deposit a suitable quantity of conductor material, depending on the size and geometry of the passages 126a and 126b. During this phase of the process, additional screen printing operations may be performed to form other hybrid circuit components during which conductor, dielectric, resistor and/or capacitor materials may be deposited on the substrate 110. All such screen printing operations, including the screen printing operation by which the conductor material is deposited to form the conductor 116, require drying and firing operations in accordance with conventional practices known in the art. The firing operation following the deposition of the conductor material in the passages 126a and 126b causes the conductor material to flow along the walls of the passages 126a and 126b, so as to form the second and third conductor segments 116b and 116c shown in FIG. 2.

The next required step is to adhere the dielectric tape 128 to the lower surface of the substrate 110. The particular method by which the dielectric tape 128 is properly adhered to the substrate 110 will depend on the specific material from which the dielectric tape 128 is formed. A particularly suitable material for use with 96 percent alumina is a glass ceramic tape identified as "852AT", available from Du Pont Electronics of Wilmington, Del. If a low temperature cofired material is used as the substrate 110, a preferred dielectric tape is a glass ceramic tape identified as "845", also available from Du Pont Electronics. Each of these tapes are laminated to the substrate 110 under conventional conditions, such as by compressing under roughly a 850 psi load at about 50° C. When properly laminated to the substrate 110, the dielectric tape 128 covers at least the first passage 126a for each terminal/external conductor pair of the electronic module 112. To do so, the dielectric tape 128 can be selectively formed using precision blanking dies or a cutting operation to cover only the first passage 126a or certain regions of the lower surface of the substrate 110, as may be preferred under some circumstances. Otherwise, the dielectric tape 128 may cover the entire lower surface of the substrate 110.

The dielectric tape 128 is then fired using a conventional firing process. For the "852TA" material, the firing process recommended by its manufacturer is a 60 minute cycle with a peak temperature of about 850° C. being sustained for about 10 minutes. For the "845" material, the manufacturer recommends a 180 minute cycle with a peak temperature of about 900° C. being sustained for about 30 minutes. Firing serves to burn out the binders within the dielectric tape 128 and transform the dielectric tape 128, which exhibits a limited degree of flexibility in the unfired "green" condition, to a fully hardened material.

The electronic module 112 and the cover 118 can then be mounted using conventional methods, such as a reflow soldering technique. Such techniques are known in the art and do not constitute the subject matter of this invention. Preferably, the cover 118 is bonded to the substrate 110 using a reflow solder technique. A suitable conductor material 121, such as a palladium-silver compound identified as "7474", available from Du Pont, is first screen printed and fired over the substrate 110. A suitable solder material 122, such as a gold-tin composition preform, is then placed on the conductor material 121, and the flange 124 of the cover 118 is reflow soldered to the substrate 110. Typically, the reflow process is conducted in a reducing atmosphere to promote the soldering process by inhibiting the formation of oxides on the metal surfaces being soldered.

When the reflow process is properly performed in accordance with conventional practices, a hermetic seal is created by the solder joint formed between the cover 118 and the substrate 110. As a hermetic seal, the solder joint serves to prevent the ingress of moisture, chemicals and debris into the cover 118, such that the electronic module 112 is protected from these otherwise destructive elements. In conjunction with the hermetic seal formed with the dielectric tape 128 at the first passage 126a, the electronic module 112 is effectively sealed off from the environment in which the hybrid integrated circuit operates.

In addition to the above preferred processing steps, those skilled in the art will recognize that numerous additional processing steps may be performed as desired or required for a particular application. Accordingly, the above method addresses only those processing steps which are necessary to hermetically seal the electronic module 112 in accordance with this invention.

From the above, it can be seen that a significant advantage of this invention is that the cover 118 is more reliably bonded to the substrate 110 than is otherwise possible by the teachings of the prior art. In particular, the method of this invention eliminates the requirement for an intermediate dielectric material 20 between the cover 118 and the substrate 110, as required by the prior art, in that the conductor 116 does not lie between the cover 118 and substrate 110, but is instead routed beneath the substrate 110 through the passages 126a and 126b. As a result, specific advantages made possible by the novel method of this invention include a more reliable and durable hermetic seal between the cover 118, which encloses the thick film electronic module 118, and the substrate 110, to which the electronic module 112 is mounted.

In addition, the method of this invention utilizes a novel approach to hermetically sealing the passages 126a and 126b in the substrate 110. The use of a dielectric tape 128 as a hermetic sealing material is highly advantageous from a processing standpoint, in that the processing required to bond the dielectric tape 128 to the substrate 110 can be readily incorporated with the processing methods conventionally involved with the fabrication of hybrid integrated circuits. From a performance standpoint, the dielectric tape materials described above have been able to form reliable hermetic seals over the passages 126a and 126b. In that the use of the dielectric tape 128 makes possible the conductor routing scheme taught by this invention, the reliability of a hybrid integrated circuit which incorporates the teachings of this invention is also improved.

While our invention has been described in terms of a preferred embodiment, it is apparent that other forms could be adopted by one skilled in the art. For example, the material composition of the dielectric tape could differ from that of the preferred glass ceramic materials, and the conventional processing techniques used could differ from those suggested. In addition, the external conductors 114 could be formed on the lower surface of the substrate 110, such that only the first passage 126a and the first and second segments 116a and 116b are required to electrically the input/output terminals 130 with their respective external conductors 114. Such an approach would involve the use of materials and processing steps which are essentially identical to those described above, and would produce the same advantageous benefits in terms of the enhanced reliability of the hermetic seal.

Accordingly, the scope of our invention is to be limited only by the following claims.

The embodiments of the invention in which an exclusive property or privilege is claimed are defined as follows:

1. A single layer ceramic substrate having an electronic module mounted to a first outer surface of said ceramic substrate, said ceramic substrate comprising:

a cover secured to said first outer surface of said ceramic substrate so as to form a hermetic seal with said ceramic substrate and enclose said electronic module on said ceramic substrate;

a first hole formed through said ceramic substrate within an area of said ceramic substrate enclosed by said cover;

a second hole formed through said ceramic substrate outside of said area enclosed by said cover:

an external conductor disposed on said first outer surface of said ceramic substrate outside of said area enclosed by said cover;

an electrical conductor for electrically interconnecting said electronic module to said external conductor, said electrical conductor having a first end electrically connected to said electronic module, a second end electrically connected to said external conductor, an intermediate portion projecting through said first hole from said first outer surface of said ceramic substrate to a second outer surface of said ceramic substrate, extending along said second outer surface to said second hole, and projecting through said second hole to electrically interconnect said first and second ends; and a dielectric tape bonded to said second outer surface of said ceramic substrate so as to hermetically seal said first hole.

2. A ceramic substrate as recited in claim 1 wherein said dielectric tape is a glass ceramic tape.

3. A single layer ceramic substrate as recited in claim 2 wherein said first and second holes are sealed with said dielectric tape.

4. A single layer ceramic substrate as recited in claim 1 wherein said dielectric tape comprises a glass ceramic tape laminated to said second outer surface of said ceramic substrate.

5. A method for electrically interconnecting an electronic module mounted to a first outer surface of a single layer ceramic substrate with an external conductor disposed on said first outer surface of said ceramic substrate, wherein said electronic module is enclosed within a cover which is bonded to said first outer surface of said ceramic substrate, and wherein said external conductor is exterior to said cover, said method comprising the steps of:

forming a first hole through said ceramic substrate within an area of said ceramic substrate to be enclosed by said cover;

forming said external conductor on said first outer surface of said ceramic substrate outside of said area enclosed by said cover;

forming a second hole through said ceramic substrate in a region corresponding to said external conductor;

forming an electrical conductor which projects through said first hole from said first outer surface of said ceramic substrate to a second outer surface of said ceramic substrate, extends along said second outer surface to said second hole, and projects through said second hole for electrically interconnecting said electronic module to said external conductor;

adhering a dielectric tape to said second outer surface of said ceramic substrate so as to hermetically seal said first hole; and soldering said cover to said first outer surface of said ceramic substrate so as to hermetically seal said electronic module within said cover.

6. A method as recited in claim 5 wherein said adhering step comprises sealing said first hole with a glass ceramic tape.

7. A method as recited in claim 5 wherein said adhering step comprises laminating said dielectric tape to said second surface and firing said dielectric tape so as to burn out binders with said dielectric tape and adhere said dielectric tape to said second surface.

8. A method as recited in claim 5 wherein said adhering step comprises sealing said first and second holes with said dielectric tape.

* * * * *